(12) United States Patent
Okano

(10) Patent No.: US 7,593,213 B2
(45) Date of Patent: Sep. 22, 2009

(54) CAPACITOR ARRANGEMENT SUPPORT SYSTEM, CAPACITOR ARRANGEMENT METHOD AND PROGRAM

(75) Inventor: Motochika Okano, Ome (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/183,467

(22) Filed: Jul. 31, 2008

(65) Prior Publication Data
US 2009/0059549 A1    Mar. 5, 2009

(30) Foreign Application Priority Data
Aug. 29, 2007    (JP)    ............... 2007-222571

(51) Int. Cl.
*H01G 4/00*    (2006.01)
(52) U.S. Cl. .............. 361/301.2; 361/301.1; 361/306.1; 361/306.2; 361/277; 361/278
(58) Field of Classification Search .............. 361/301.1, 361/301.2, 272–273, 277–278, 286–292, 361/306.1, 306.2, 306.3
See application file for complete search history.

(56) References Cited

U.S. PATENT DOCUMENTS 6,297,966 B1 * 10/2001 Lee et al. .................... 361/799
6,362,966 B1 * 3/2002 Ali et al. ..................... 361/728
6,538,196 B1 * 3/2003 MacDonald et al. ........ 174/377
7,459,784 B2 * 12/2008 Wehrly et al. ............... 257/707

FOREIGN PATENT DOCUMENTS

| JP | 05-334394 | 12/1993 |
| JP | 2001-101257 | 4/2001 |
| JP | 2001-203434 | 7/2001 |

* cited by examiner

*Primary Examiner*—Nguyen T Ha
(74) *Attorney, Agent, or Firm*—Pillsbury Winthrop Shaw Pittman, LLP

(57) ABSTRACT

According to one embodiment, a capacitor arrangement support system includes a resonance analysis module configured to perform a resonance analysis based on data of a component producing electromagnetic radiation, a resonance point extraction module configured to extract a resonance point from an analysis result of the resonance analysis module, an electromagnetically radiated energy analysis module configured to analyze the ease of collection of electromagnetically radiated energy with respect to a resonance point extracted by the resonance point extraction module, a determination module configured to determine whether or not an absolute value of a value showing the ease of collection of electromagnetically radiated energy is larger than a preset absolute value, and a capacitor arrangement module configured to arrange a capacitor for suppressing electromagnetic radiation at a resonance point where the determination module determines that data of the component is larger the preset absolute value.

9 Claims, 4 Drawing Sheets

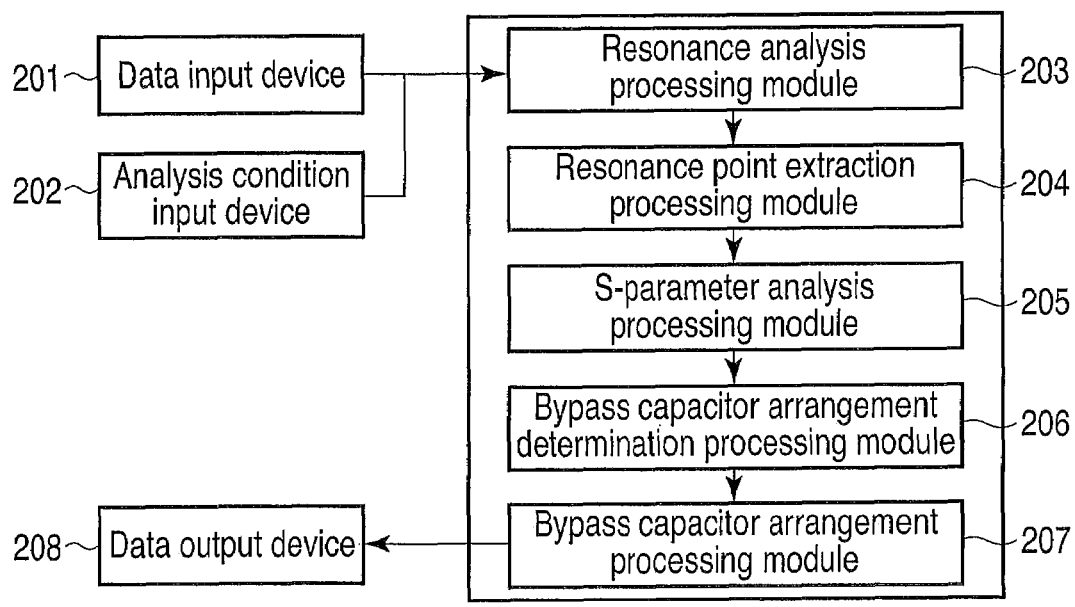
F I G. 1

CAPACITOR ARRANGEMENT SUPPORT SYSTEM, CAPACITOR ARRANGEMENT METHOD AND PROGRAM

CROSS-REFERENCE TO RELATED APPLICATIONS

This application is based upon and claims the benefit of priority from Japanese Patent Application No. 2007-222571, filed Aug. 29, 2007, the entire contents of which are incorporated herein by reference.

BACKGROUND

1. Field

One embodiment of the invention relates to a capacitor arrangement support system for arranging on a component a capacitor for preventing electromagnetic radiation, and to a capacitor arrangement method and a program.

2. Description of the Related Art

A capacitor is interposed between a ground pattern and a power plate in order to prevent electromagnetic radiation from a printed wiring board. A capacitor is arranged at a resonance point based on a resonance analysis (see Jpn. Pat. Appln. KOKAI Publication No. 2001-101257).

A resonance analysis is made, and thereby, a capacitor is arranged at the obtained resonance point. However, if the capacitor is arranged at random, the number of components increases. As a result, there is a problem of increasing the cost and the area occupied by components.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1 is an exemplary block diagram showing the configuration of a capacitor arrangement support system according to one embodiment of the present invention;

DETAILED DESCRIPTION

Figure 2:
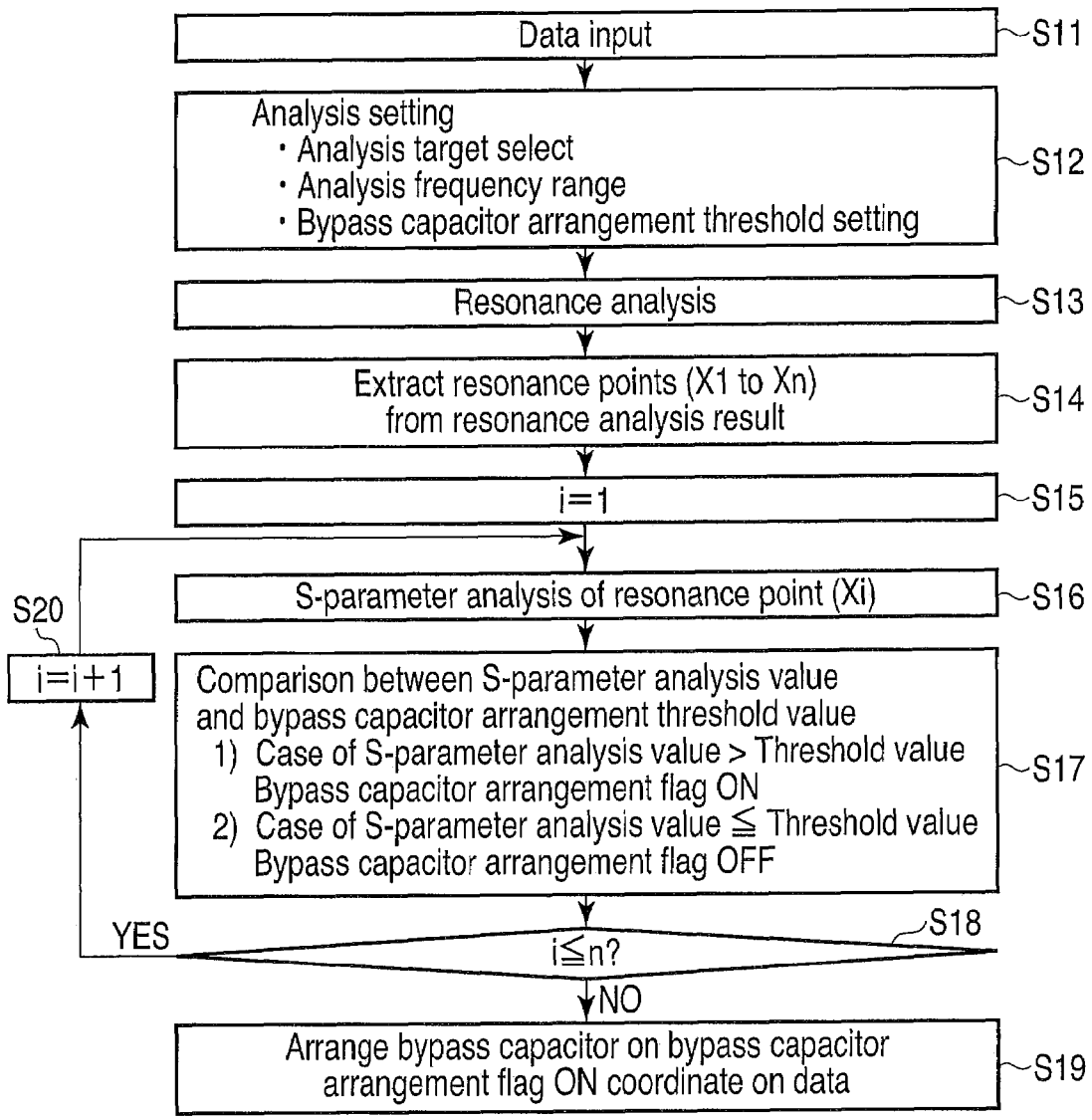
FIG. 2 is an exemplary flowchart to explain the procedure of a capacitor arrangement support system.

Various embodiments according to the invention will be described hereinafter with reference to the accompanying drawings. In general, according to one embodiment of the invention, a capacitor arrangement support system comprises a resonance analysis module configured to perform a resonance analysis based on data of a component producing electromagnetic radiation, a resonance point extraction module configured to extract a resonance point from an analysis result of the resonance analysis module, an electromagnetically radiated energy analysis module configured to analyze the ease of collection of electromagnetically radiated energy with respect to a resonance point extracted by the resonance point extraction module, a determination module configured to determine whether or not an absolute value of a value showing the ease of collection of electromagnetically radiated energy is larger than a preset absolute value, and a capacitor arrangement module configured to arrange a capacitor for suppressing electromagnetic radiation at a resonance point where the determination module determines that data of the component is larger the preset absolute value.

FIG. 1 is a block diagram showing the configuration of a capacitor arrangement support system according to one embodiment of the present invention.

The capacitor arrangement support system includes a data input device 201, an analysis condition input device 202, a resonance analysis processing module 203, and a resonance point extraction processing module 204. The system further includes an S-parameter analysis processing module 205, a bypass capacitor arrangement determination processing module 206, a bypass capacitor arrangement processing module 207 and a data output device 208.

According to this embodiment, the foregoing resonance analysis processing module 203, resonance point extraction processing module 204, S-parameter analysis processing module 205, bypass capacitor arrangement determination processing module 206, and bypass capacitor arrangement processing module 207 of the capacitor arrangement support system are realized by a computer program executed by a computer.

The data input device 201 is a keyboard and a mouse, which are operated by the user. The data input device 201 is used to register board data from a memory stored with data of a board producing electromagnetic radiation in the resonance analysis processing module 203. The board data includes CAD data including a shape of a wiring board, each shape of power and ground layers and the dielectric constant of a dielectric material used for the wiring board. The analysis condition input device 202 is a keyboard and a mouse, which are operated by the user. The analysis condition input device 202 is used to register an analysis target, that is, power and ground layers in CAD data and analysis conditions such as S-parameter threshold and analysis frequency range in the resonance analysis processing module 203. The resonance analysis processing module 203 performs a resonance analysis (intrinsic analysis) based on the board data input from the data input device 201 and the analysis condition input from the analysis condition input device 202. The resonance point extraction processing module 204 extracts a resonance point from the analysis result of the resonance analysis processing module 203. The S-parameter analysis processing module 205 analyzes the S-parameter showing the ease of collection of electromagnetically radiated energy of the resonance point extracted by the resonance point extraction processing module 204. The bypass capacitor arrangement determination processing module 206 determines whether or not an EMI suppression bypass capacitor for suppressing EMI radiated from an electronic apparatus in accordance with the S-parameter obtained by the S-parameter analysis processing module 205. The bypass capacitor arrangement processing module 207 arranges a bypass capacitor on the board data of a portion determined as being arrangeable by the bypass capacitor arrangement determination processing module 206. The data output device 208 is a display device and hardware. The display device displays board data on which a bypass capacitor is arranged. The hardware is used for storing the board data in the memory. If the foregoing ease of collection of electromagnetically radiated energy is analyzed, an analysis method except the S-parameter method may be used.

Incidentally, the procedures executed by the foregoing resonance analysis processing module 203, resonance point extraction processing module 204, S-parameter analysis processing module 205, bypass capacitor arrangement determination processing module 206, and bypass capacitor arrangement processing module 207 are realized by a computer program executed by a computer.

The procedure of the bypass capacitor arrangement support system will be explained below with reference to a flowchart of FIG. 2.

Figure 3:
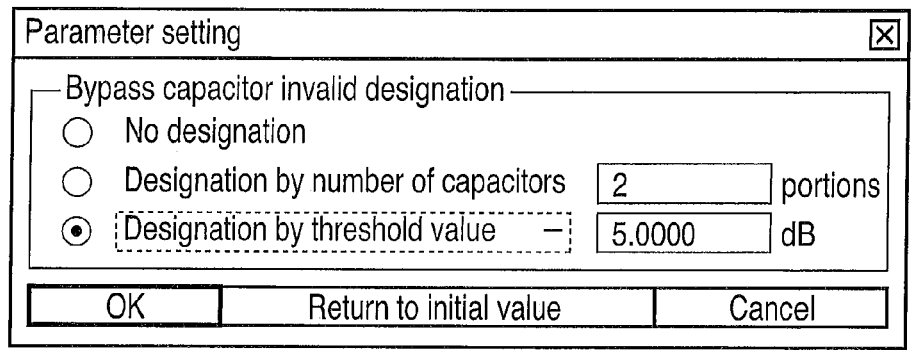
FIG. 3 is an exemplary view showing a window displayed on a display device for inputting an S-parameter threshold.

The data input device 201 inputs board data selected by the user to the resonance analysis processing module 203 (step S11). The analysis condition input device 202 inputs the analysis conditions, that is, the analysis target, analysis frequency range and S-parameter threshold, which are input by the user, to the resonance analysis processing module 203 (step S12). The user inputs the S-parameter threshold as a preset value using a window shown in FIG. 3 displayed on the display device. In this case, the user can designate the number of bypass capacitors to be arranged in place of the S-parameter threshold. If the user designates the number of bypass capacitors to be arranged, the bypass capacitor is arranged in the order from the resonance point having the highest S-parameter analysis value.

Figure 4:
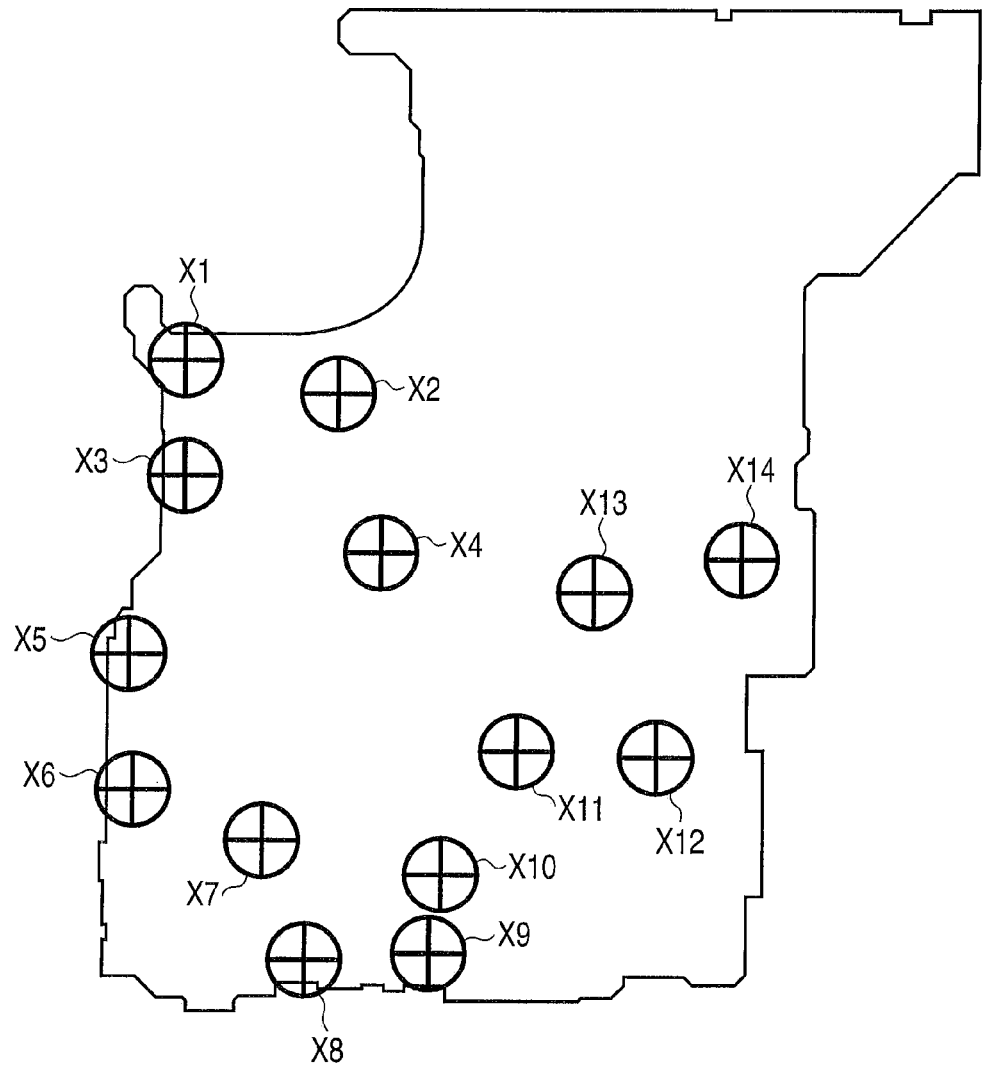
FIG. 4 is an exemplary view showing resonance points extracted by the procedure of a resonance point extraction processing module.

The resonance analysis processing module 203 performs a resonance analysis (intrinsic analysis) based on the inputted board data (step S13). The resonance point extraction processing module 204 extracts resonance points (X1 to Xn) (step S14). In FIG. 4, there are shown resonance points on a board. As seen from FIG. 4, resonance points X1 to X14 are extracted, for example.

Figure 5:
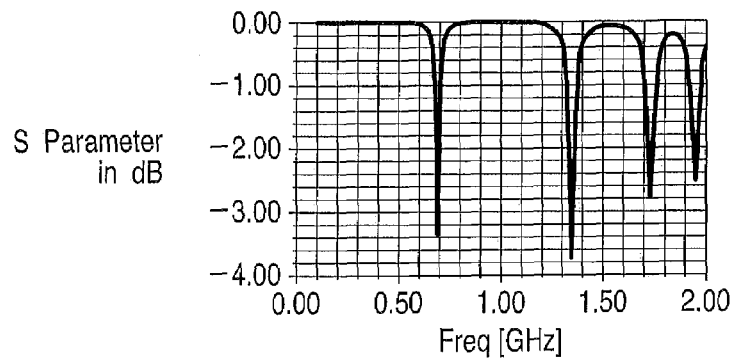
FIG. 5 is an exemplary graph showing an S-parameter analysis result by an S-parameter analysis processing module.

The S-parameter analysis processing module 205 analyzes the S-parameter of the extracted resonance point Xi (step S16). FIG. 5 shows an S-parameter analysis result. As shown in FIG. 5, the S-parameter has a frequency dependency, and has a turning value at a specific frequency. An absolute value of the S-parameter having the maximum absolute value of the turning value is set as an S-parameter analysis value.

The bypass capacitor arrangement determination processing module 206 determines whether or not the S-parameter analysis value is larger than the absolute value of the S-parameter threshold input in step S12 (step S17). If the S-parameter analysis value is larger than the absolute value of the S-parameter threshold, the bypass capacitor arrangement determination processing module 206 sets on a bypass capacitor arrangement flag with respect to the resonance point Xi. Conversely, if the S-parameter analysis value is not larger than the absolute value of the S-parameter threshold, the bypass capacitor arrangement determination processing module 206 sets off a bypass capacitor arrangement flag with respect to the resonance point Xi. The procedures of steps S16 and S17 are carried out with respect to the resonance point.

Figure 6:
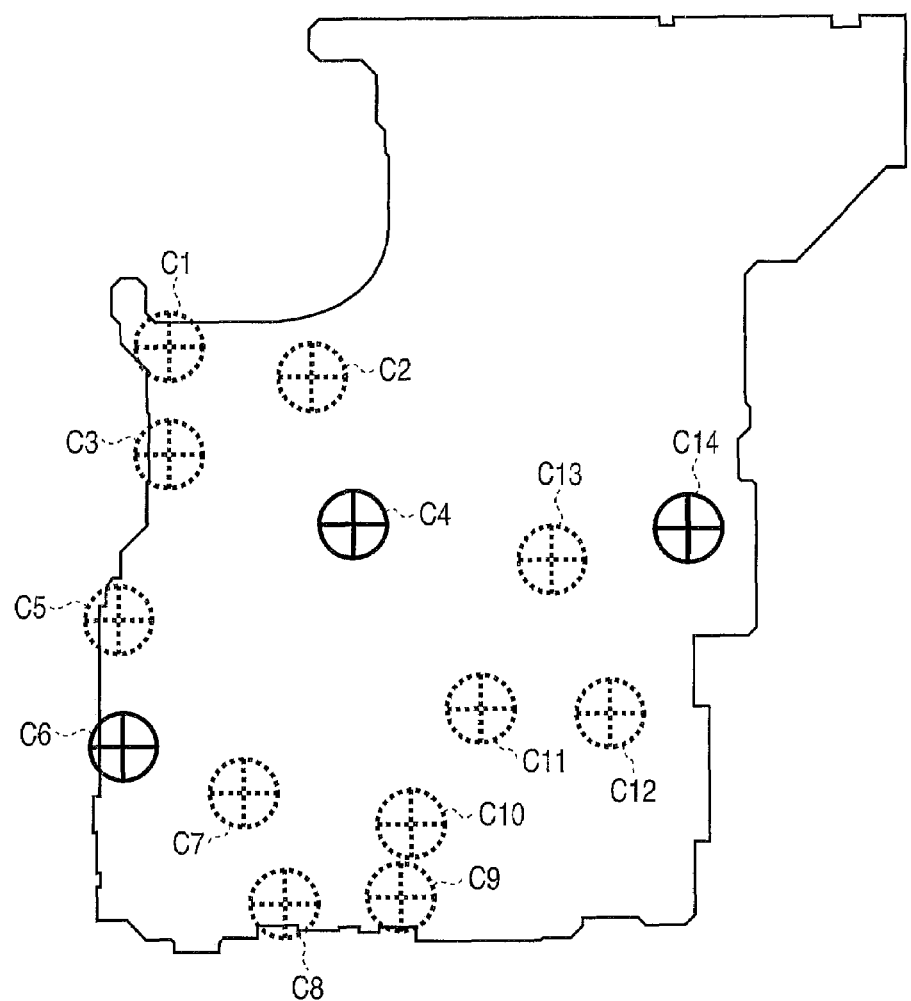
FIG. 6 is an exemplary view showing a position of a capacitor arranged on a board.

The procedures of steps S16 and S17 are carried out with respect to all resonance points (No in step S18). Thereafter, the bypass capacitor arrangement processing module 207 arranges a bypass capacitor at all resonance points where the bypass capacitor arrangement flag set on. The bypass capacitor arrangement ends, and thereafter, the bypass capacitor arrangement processing module 207 outputs board data on which bypass capacitors are arranged to display the board data on the display device, and stores the board data in the storage device. FIG. 6 shows one example of the board data on which bypass capacitors are arranged. As depicted in FIG. 6, the bypass capacitor is arranged at three portions, that is, X4, X6 and X14. In a state shown in FIG. 14, 14 bypass capacitors are arranged; therefore, 11 bypass capacitors are reduced.

As a result, the number of bypass capacitors to be arranged is reduced, and thus, this serves to reduce the cost of a printed wiring board.

According to this embodiment, the board is given as the component producing electromagnetic radiation. The same procedure as above is possible in a resonance analysis including a housing producing electromagnetic radiation.

In the bypass capacitor arrangement support system of this embodiment, the procedure for supporting a bypass capacitor arrangement design is realized by a computer program. Thus, the computer program is only installed on a normal computer via a computer readable storage medium, and thereby, the same effect as this embodiment is easily realized. In addition, the computer program is executable on an electronic apparatus having a built-in processor in addition to a personal computer.

The various modules of the systems described herein can be implemented as software applications, hardware and/or software modules, or components on one or more computers, such as servers. While the various modules are illustrated separately, they may share some or all of the same underlying logic or code.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A capacitor arrangement support system comprising:
   a resonance analysis module configured to perform a resonance analysis based on data of a component producing electromagnetic radiation;
   a resonance point extraction module configured to extract a resonance point from an analysis result of the resonance analysis module;
   an electromagnetically radiated energy analysis module configured to analyze the ease of collection of electromagnetically radiated energy with respect to a resonance point extracted by the resonance point extraction module;
   a determination module configured to determine whether or not an absolute value of a value showing the ease of collection of electromagnetically radiated energy is larger than a preset absolute value; and
   a capacitor arrangement module configured to arrange a capacitor for suppressing electromagnetic radiation at a resonance point where the determination module determines that data of the component is larger than the present absolute value.

2. The system according to claim 1, wherein the electromagnetically radiated energy analysis module analyzes an S-parameter as ease of collection of electromagnetically radiated energy.

3. The system according to claim 1, wherein the component is a wiring board or housing.

4. A capacitor arrangement method comprising:
   performing a resonance analysis based on data of a component producing electromagnetic radiation;

extracting a resonance point from an analysis result of the resonance analysis;

analyzing the ease of collection of electromagnetically radiated energy with respect to a resonance point extracted determining whether or not an absolute value of a value showing the ease of collection of electromagnetically radiated energy is larger than a preset absolute value with respect to the extracted resonance point; and arranging a capacitor for preventing electromagnetic radiation at a resonance point for which it has been determined that data of the component is larger than the present absolute value.

5. The method according to claim 4, wherein an S-parameter is analyzed as ease of collection of electromagnetically radiated energy.

6. The method according to claim 4, wherein the component is a wiring board or housing.

7. A program which is stored in a computer readable media and cause a computer to perform supporting a capacitor arrangement for preventing electromagnetic radiation, comprising:

causing the computer to perform a resonance analysis based on data of a component producing electromagnetic radiation;

causing the computer to extract a resonance point from an analysis result of the resonance analysis;

causing the computer to analyze ease of collection of electromagnetically radiated energy with respect to a resonance point extracted causing the computer to determine whether or not an absolute value of a value showing the ease of collection of electromagnetically radiated energy is larger than a preset absolute value with respect to the extracted resonance point; and causing the computer to arrange a capacitor for preventing electromagnetic radiation at a resonance point for which it has been determined that data of the component is larger than the present absolute value.

8. The program according to claim 7, wherein an S-parameter is analyzed as ease of collection of electromagnetically radiated energy.

9. The program according to claim 7, wherein the component is a wiring board or housing.

\* \* \* \* \*